United States Patent
Goluch et al.

(10) Patent No.: US 9,321,087 B2
(45) Date of Patent: Apr. 26, 2016

(54) APPARATUS AND METHOD FOR SCANNING AN OBJECT THROUGH A FLUID SPRAY

(71) Applicant: TEL FSI, Inc., Chaska, MN (US)

(72) Inventors: Mark Goluch, St. Louis Park, MN (US); David C. Zimmerman, Prior Lake, MN (US); Robert E. Larson, Mound, MN (US); Edward Deneen Hanzlik, Shorewood, MN (US); Gregory Paul Thomes, Chaska, MN (US); Christina Ann Rathman, Ellsworth, WI (US)

(73) Assignee: TFL FSI, Inc., Chaska, MN (US)

( * ) Notice: Subject to any disclaimer, the term of this patent is extended or adjusted under 35 U.S.C. 154(b) by 245 days.

(21) Appl. No.: 14/022,979

(22) Filed: Sep. 10, 2013

(65) Prior Publication Data

US 2015/0068560 A1    Mar. 12, 2015

(51) Int. Cl.
*B08B 3/00* (2006.01)
*B08B 5/02* (2006.01)
*H01L 21/687* (2006.01)
*H01L 21/67* (2006.01)
*B08B 3/02* (2006.01)
*B08B 3/04* (2006.01)

(52) U.S. Cl.
CPC ... *B08B 5/02* (2013.01); *B08B 3/02* (2013.01); *H01L 21/6708* (2013.01); *H01L 21/67051* (2013.01); *H01L 21/68742* (2013.01); *H01L 21/68764* (2013.01); *B08B 3/022* (2013.01); *B08B 3/024* (2013.01); *B08B 3/04* (2013.01); *H01L 21/67023* (2013.01)

(58) Field of Classification Search
CPC ...... H01L 21/67023; B01B 5/02; B08B 3/02; B08B 3/022; B08B 3/024; B08B 3/04
See application file for complete search history.

(56) References Cited

U.S. PATENT DOCUMENTS

| | | | |
|---|---|---|---|
| 2,286,927 A | 3/1941 | Parish | |
| 5,062,898 A | 11/1991 | McDermott et al. | |
| 5,209,028 A | 5/1993 | McDermott et al. | |
| 5,294,261 A | 3/1994 | McDermott et al. | |
| 5,810,942 A * | 9/1998 | Narayanswami et al. | 134/7 |
| 5,942,037 A | 8/1999 | Wagener et al. | |
| 6,251,195 B1 * | 6/2001 | Wagener et al. | 134/7 |
| 2004/0184792 A1 | 9/2004 | Hamelin et al. | |
| 2005/0282371 A1 * | 12/2005 | Patton et al. | 438/597 |
| 2007/0256923 A1 | 11/2007 | Schneider | |
| 2007/0261726 A1 * | 11/2007 | Rye et al. | 134/157 |
| 2011/0011335 A1 | 1/2011 | Thie et al. | |
| 2012/0272893 A1 | 11/2012 | Lauerhaas et al. | |
| 2013/0109189 A1 * | 5/2013 | Cho et al. | 438/710 |

* cited by examiner

*Primary Examiner* — Bibi Carrillo
*Assistant Examiner* — Sharidan Carrillo
(74) *Attorney, Agent, or Firm* — Kagan Binder, PLLC

(57) ABSTRACT

An apparatus for treating the surface of a microelectronic workpiece via impingement of the surface with at least one fluid and a method for operating the apparatus are described. In particular, the apparatus includes a treatment chamber defining an interior space to treat the microelectronic workpiece with at least one fluid within the treatment chamber, and a movable chuck that supports the workpiece within the treatment chamber. The apparatus further includes a workpiece translational drive system configured to translate the movable chuck between a workpiece load position and at least one processing position at which the workpiece is treated with the at least one fluid using at least one nozzle connected to at least one fluid supply, and a workpiece rotational drive system configured to rotate the microelectronic workpiece.

9 Claims, 8 Drawing Sheets

APPARATUS AND METHOD FOR SCANNING AN OBJECT THROUGH A FLUID SPRAY

BACKGROUND OF THE INVENTION

1. Field of Invention

The invention relates to an apparatus and method for treating the surface of a microelectronic workpiece, and in particular, an apparatus and method for scanning the microelectronic workpiece through a fluid used to treat an exposed surface of the microelectronic workpiece.

2. Description of Related Art

Advances in microelectronic technology cause integrated circuits (ICs) to be formed on microelectronic workpieces, such as semiconductor substrates, with ever increasing density of active components. The formation of ICs is carried out by sequential application, processing, and selective removal of various materials on the workpiece. And, during formation, the exposed surface of the workpiece requires cleaning steps to periodically remove process residue and debris. Various compositions have been developed for removal of specific classes of materials from substrates in semiconductor substrate processing, including both dry and wet cleaning technologies.

However, more recently, cryogenic aerosols have been developed to remove particulate from workpiece surfaces using momentum transfer from the impinging cryogenic aerosol jet. This dry cleaning application has been particularly useful in semiconductor manufacturing. Cryogens that have been used for removal of particulate contamination include argon, carbon dioxide, and water. In cryogenic aerosols, an aerosol jet is produced containing frozen particles moving at subsonic or supersonic speeds. Therein, the size of the frozen particles depends on the thermodynamic conditions of the jet, including the pressure, temperature, flow, and the particle forming conditions, which depends largely on the initial phase of the material supplied for forming the jet and the nozzle design. As noted above, carbon dioxide and water have been used in certain applications. However, for high purity cleaning in semiconductor manufacturing, the avoidance of surface damage is of great import. Therefore, nitrogen and nitrogen/argon mixtures have been used for semiconductor substrate cleaning.

Although cryogenic aerosols have proved effective in removing particles from contaminated workpieces, a problem has been discovered in the cleaning process whereby particles that have been removed from a substrate at times re-contaminate cleaned surfaces of the workpiece. In particular, it has been discovered that such re-contamination occurs when the aerosol jet impinges on portions of the workpiece table that is scanned through the aerosol jet. Particulate on the upper surface of these portions of the workpiece table are dislodged and, in part, transferred to the workpiece surface. Moreover, particulate on the peripheral edge of the workpiece, as a result of prior handling, may be redistributed to the center of the workpiece using conventional scanning techniques.

SUMMARY OF THE INVENTION

Embodiments of the invention relate to an apparatus and method for treating the surface of a microelectronic workpiece, and in particular, relate to an apparatus and method for scanning the microelectronic workpiece through a fluid used to treat an exposed surface of the microelectronic workpiece. According to one embodiment, an apparatus for treating the surface of a microelectronic workpiece via impingement of the surface with at least one fluid is described. The apparatus includes: a treatment chamber defining an interior space to treat a microelectronic workpiece with at least one fluid within the treatment chamber; a movable chuck that supports the workpiece within the treatment chamber, the workpiece having an upper surface exposed in a position for treatment by the at least one fluid; a workpiece translational drive system operatively coupled to the movable chuck and configured to translate the movable chuck between a workpiece load position and at least one processing position at which the workpiece is treated with the at least one fluid; a workpiece rotational drive system operatively coupled to the treatment chamber and configured to rotate the workpiece; and at least one nozzle connected to at least one fluid supply and arranged within the treatment chamber in a manner effective to direct the at least one fluid towards the upper surface of the workpiece when the movable chuck is positioned in the at least one processing position and supports the workpiece.

According to another embodiment, a method for treating the surface of a workpiece via impingement of the surface with a fluid is described. The method includes: disposing a workpiece to be treated on a movable chuck in a treatment chamber defining an interior space for providing a fluid from a nozzle operatively arranged within the treatment chamber, the workpiece being placed upon the movable chuck located in a load position separated from direct impingement of the fluid on an upper surface of the workpiece; scanning the movable chuck with the workpiece from the load position to a first processing position under the nozzle such that a first fractional portion of the upper surface of the workpiece is exposed to the fluid; and rotating the workpiece relative to the nozzle.

DETAILED DESCRIPTION OF SEVERAL EMBODIMENTS

Figure 1:
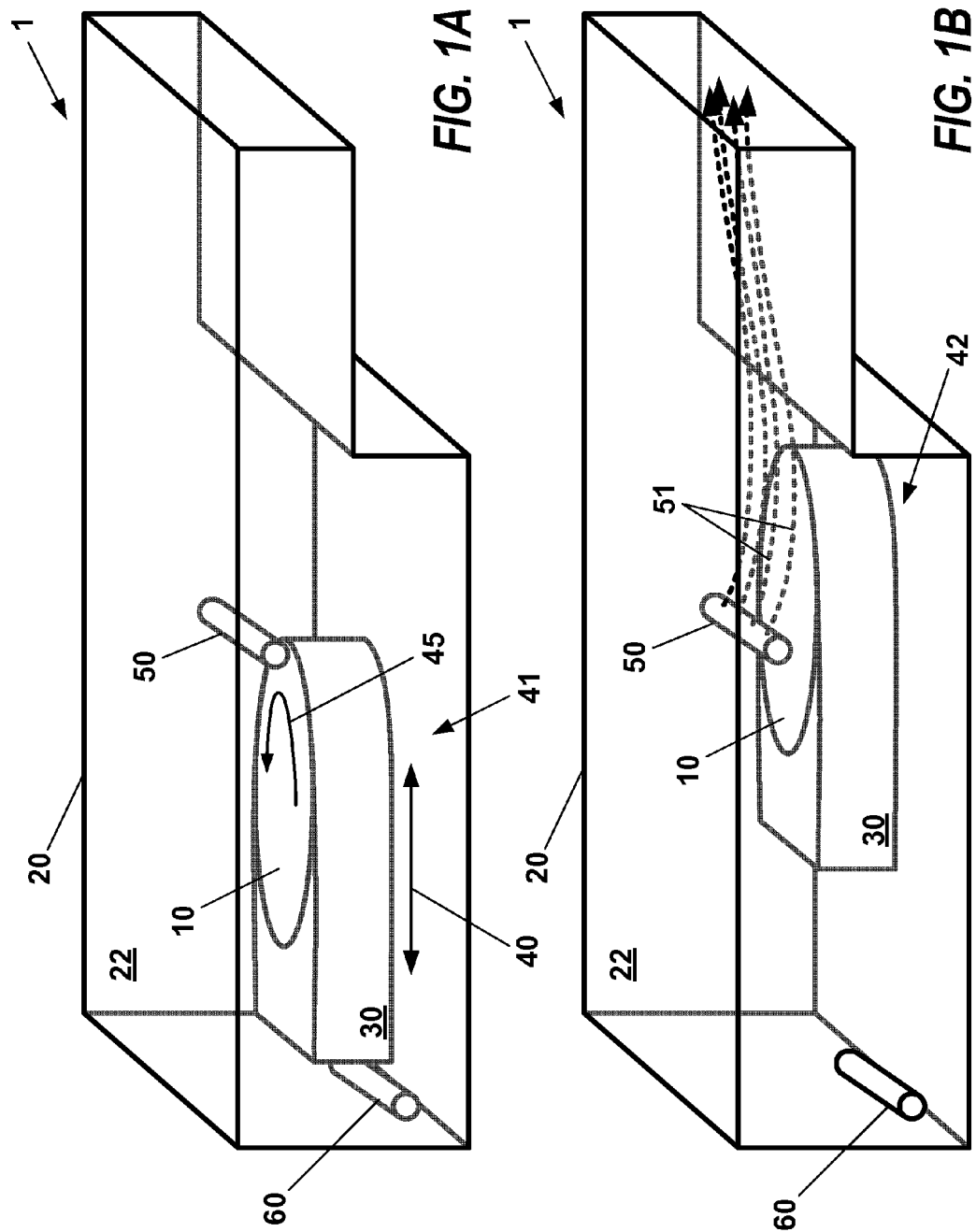
FIGS. 1A and 1B are schematic illustrations of a treatment apparatus in perspective view according to embodiments of the present invention.

Methods for selectively removing material from a substrate are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

An apparatus and method for treating the surface of a microelectronic workpiece are described below. In particular, an apparatus and method for scanning the microelectronic workpiece through a fluid used to treat an exposed surface of the microelectronic workpiece is described. The fluid or fluid spray may include any gas-phase, liquid-phase, or mixed-phase fluid stream dispensed onto the microelectronic workpiece. For example, the fluid or fluid spray may include a gaseous jet, a vapor jet, a liquid jet or spray, an aerosol jet or spray, a gas cluster jet, a gas cluster beam (GCB), a gas cluster ion beam (GCIB), a charged particle beam, or any combination of two or more thereof. And, while the apparatus and method for scanning the microelectronic workpiece are applicable to processing the microelectronic workpiece in any one of the aforementioned fluid regimes, sprays, beams, etc., the invention will be described in the context of applying a cryogenic aerosol.

Figure 2:
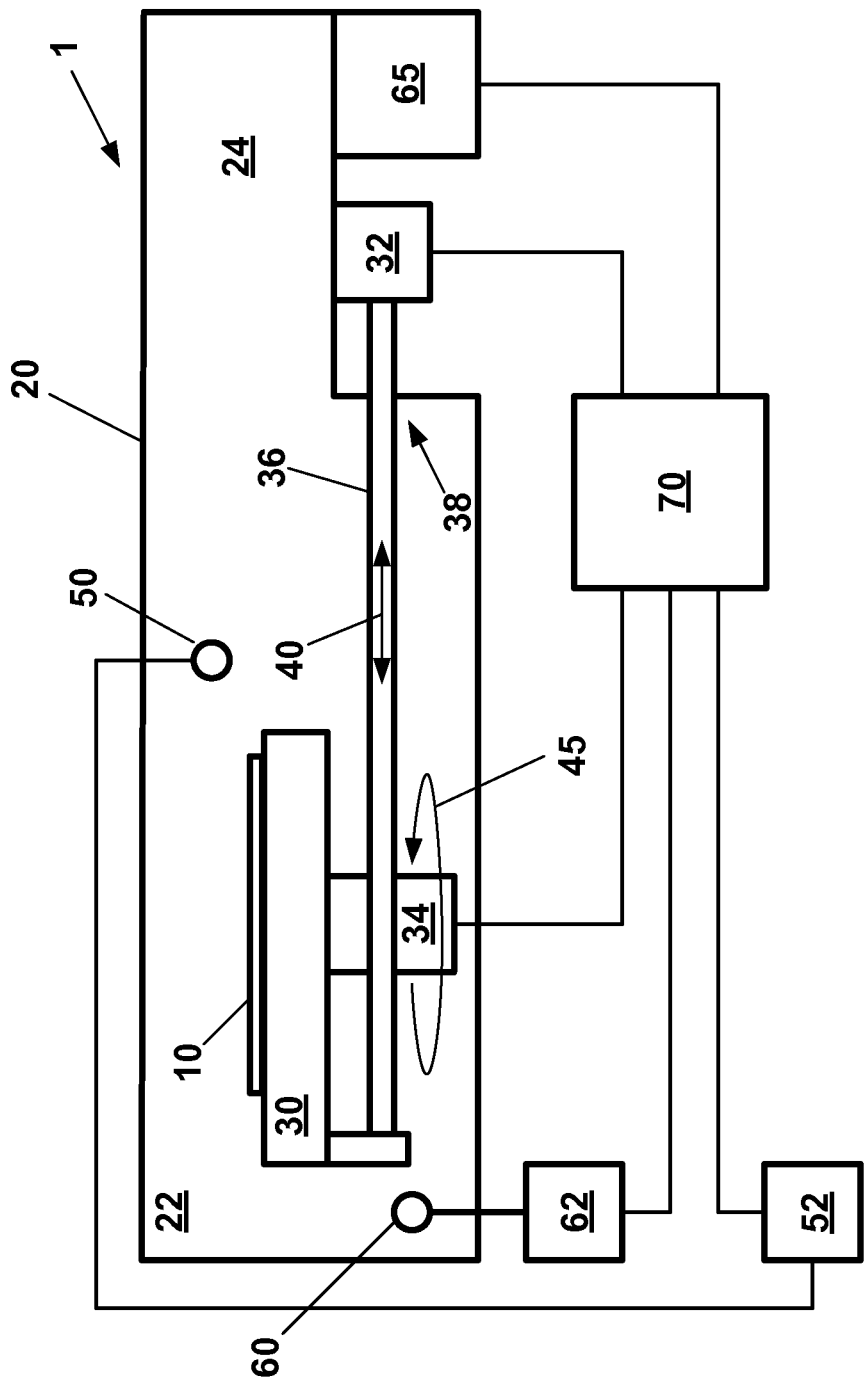
FIG. 2 is a side view a treatment apparatus according to an embodiment of the present invention.

Referring now to the drawings, wherein like reference numerals designate identical or corresponding parts throughout the several views, FIGS. 1A and 1B provide a schematic illustration in perspective view of a treatment apparatus 1 for treating an exposed surface of a microelectronic workpiece 10. Furthermore, FIG. 2 provides a side view of the treatment apparatus 1. The treatment apparatus 1 may be used for applying a fluid spray to an exposed surface of microelectronic workpiece 10, e.g., a semiconductor substrate, micro-electro-mechanical (MEM) substrate, or photovoltaic substrate, wherein such fluid spray application may facilitate etching, coating, cleaning, or the like. As an example, the treatment apparatus 1 may be used to remove particulate debris from an upper surface of microelectronic workpiece 10.

In one embodiment, the treatment apparatus is particularly applicable for use as a cryogenic aerosol cleaning chamber used for cleaning contaminants from semiconductor substrates. As set forth above, cryogenic cleaning may use aerosols of nitrogen, nitrogen/argon mixtures, carbon dioxide, or water, for example. At present, aerosols containing argon and nitrogen are preferred. Specific examples of cryogenic aerosols are disclosed in U.S. Pat. Nos. 5,062,898, 5,209,028, and 5,294,261, all to McDermott, et al.; the contents of which are hereby incorporated by reference in their entirety.

Treatment apparatus 1 can include a treatment chamber 20 defining an interior space 22 (or volume) to treat microelectronic workpiece 10 with at least one fluid spray within the treatment chamber 20, wherein the treatment chamber further includes an exhaust duct 24 to direct the flow of material exiting the interior space 22 to a vacuum pump 65. Within the interior space 22, the treatment apparatus 1 can include a movable chuck 30 that supports workpiece 10 within the treatment chamber 20, and at least one nozzle 50 arranged within the treatment chamber 20 in a manner effective to direct at least one fluid spray 51 towards the upper surface of workpiece 10.

The at least one nozzle 50 is supported within the treatment chamber 20, and includes at least one nozzle orifice. For example, the at least one nozzle may include a nozzle spray bar including a series of jet spray openings along the length of the nozzle spray bar so that fluid spray, e.g., an aerosol, can be expelled from the at least one nozzle 50 towards the exposed surface of the microelectronic workpiece 10. The at least one nozzle 50 may be adjustable so that the angle of the fluid spray impingement on the microelectronic workpiece 10 can be optimized for a particular treatment process. The at least one nozzle 50 is coupled to a fluid supply system 52. When the fluid spray includes a cryogenic aerosol, the fluid supply system 52 may include a liquid cryogen reservoir, such as a liquid nitrogen dewar, through which one or more gasses, e.g., nitrogen and optionally nitrogen/argon mixtures, are circulated to produce a partially liquefied fluid supply to the at least one nozzle 50. Various equipment including flow control devices, pressure control devices, etc. for the delivery of fluid to the at least one nozzle 50 are contemplated.

Additionally, as depicted in FIGS. 1A, 1B, and 2, the treatment apparatus 1 includes vacuum pump 65 that is provided to evacuate material from the treatment chamber 20 and control the pressure in the treatment chamber 20 to a reduced-pressure environment (relative to atmospheric pressure). As shown, the vacuum pump 65 may be coupled to an outlet end of the exhaust duct 24.

Furthermore, as depicted in FIGS. 1A, 1B, and 2, the treatment apparatus 1 may include a process gas nozzle 60, or gas nozzle array, arranged at an inlet end of the treatment chamber 20 to introduce a process gas to interior space 22 that flows from the inlet end of treatment chamber 20 to an outlet end of the treatment chamber 20 through exhaust duct 24 to vacuum pump 65. A process gas supply system 62 is coupled to the process gas nozzle 60, and configured to supply the process gas nozzle 60 with process gas, which may include reactive or non-reactive (inert relative to materials on microelectronic workpiece 10) process gas or vapor. The process gas nozzle 60 may include a nozzle or orifice array, or a porous member, such as a metal foam. As an example, when using the treatment chamber 20 for treating the microelectronic workpiece 10 with a cryogenic aerosol, the process gas may include an inert gas introduced at a flow rate sufficient to establish a laminar flow over the microelectronic workpiece 10 that entrains residual aerosol and particulate dis-lodged from the exposed surface of the microelectronic workpiece 10. Various equipment including flow control devices, pressure control devices, etc. for the delivery of process gas to the process gas nozzle 60 are contemplated.

The movable chuck 30 is movably supported so that the exposed surface of microelectronic workpiece 10 to be treated can be at least partly scanned through the impingement area of the at least one fluid spray emanating from the at least one nozzle 50. As will be described in greater detail below, the movable chuck 30 provides at least one translational degree of freedom 40, preferably along the longitudinal axis of the treatment chamber 20, to facilitate linear scanning at least a portion of microelectronic workpiece 10 through the fluid spray emanating from the at least one nozzle 50. Furthermore, the movable chuck 30 provides at least one rotational degree of freedom 45, preferably about an axis normal to the exposed surface of the microelectronic workpiece 10, to facilitate rotatably indexing the microelectronic workpiece 10 from a first pre-determined indexed position that exposes a first fractional portion of the microelectronic workpiece 10 to the fluid spray when scanning the microelectronic workpiece during a first scan, to a second pre-determined indexed position that exposes a second fractional portion of the microelectronic workpiece 10 to the fluid spray when scanning the microelectronic workpiece during a second scan.

As shown in FIGS. 1A, 1B, and 2, the treatment apparatus 1 includes a workpiece translational drive system 32 operatively coupled to the movable chuck 30 and configured to translate the movable chuck 30 along at least one translational degree of freedom 40 between a workpiece load position 41 (see FIG. 1A) and at least one processing position 42 (see FIG. 1B) at which the workpiece 10 is treated with the at least one fluid spray 51.

The movable chuck 30 is configured to translate along the longitudinal axis of the treatment chamber 20, as shown in FIGS. 1A, 1B, and 2. However, the movable chuck 30 may be designed to include additional translational degrees of freedom. The workpiece translational drive system 32 may include one or more slides and guiding mechanisms to define the path of movement of the movable chuck 30, and an actuating mechanism may be utilized to impart the movement to the movable chuck 30 along its guide path. The actuating mechanism may comprise any electrical, mechanical, electromechanical, hydraulic, or pneumatic device. The actuating mechanism is designed to provide a range of motion sufficient in length to permit movement of the exposed surface of the microelectronic workpiece 10 at least partly through the area of fluid spray impingement emanating from the at least one nozzle. As an example and as illustrated in FIG. 2, the workpiece translational drive system 32 may include a support arm 36 arranged to slidably extend through a sliding vacuum seal 38 in a wall of treatment chamber 20, wherein a first distal end is mounted to the movable chuck 30 and a second distal end is engaged with an actuator mechanism located outside the treatment chamber 20.

As further shown in FIGS. 1A, 1B, and 2, the treatment apparatus 1 includes a workpiece rotational drive system 34 operatively coupled to the treatment chamber 20 and configured to rotate the microelectronic workpiece 10. The workpiece rotational drive system 34 can rotatably index the microelectronic workpiece 10 from a first predetermined indexed orientation to a second predetermined indexed orientation. In one embodiment, the workpiece rotational drive system 34 is operatively coupled to the movable chuck 30 and configured to rotate the microelectronic workpiece on the movable chuck 30. The workpiece rotational drive system 34 may include an actuating mechanism utilized to impart the rotational movement to the movable chuck 30 about its axis. The actuating mechanism may comprise any electrical, mechanical, electromechanical, hydraulic, or pneumatic device. As an example, the workpiece rotational drive system 34 can include an indexing motor, with or without a belt or gear drive, configured to rotatably index the microelectronic workpiece 10 on the movable chuck 30 from the first predetermined indexed orientation to the second predetermined indexed orientation.

In another embodiment, the workpiece rotational drive system 34 may include a workpiece lift system arranged beneath the movable chuck 30, and configured to translate vertically and rotate the microelectronic workpiece 10 relative to the movable chuck 30. The workpiece lift system may include three or more lift pins arranged to extend through one or more openings in the movable chuck 30, a vertical lift system arranged to vertically translate the three or more pins to lift the microelectronic workpiece above the movable chuck 30 and lower the microelectronic workpiece to the movable chuck 30, and an indexing motor arranged to rotate the microelectronic workpiece on the three or more lift pins relative to the movable chuck 30 from a first predetermined indexed orientation to a second predetermined indexed orientation.

While not shown in FIGS. 1A, 1B, and 2, the movable chuck 30 may include a mechanism for securing the microelectronic workpiece 10 to an upper surface of the movable chuck 30 during impingement of the at least one fluid spray on the exposed surface of the microelectronic workpiece 10. Microelectronic workpiece 10 may be affixed to the movable chuck 30 using mechanical fasteners or clamps, vacuum clamping, or electrostatic clamping, for example.

Furthermore, the movable chuck 30 may include a temperature control mechanism to control a temperature of the microelectronic workpiece 10 at a temperature elevated above or depressed below ambient temperature. The temperature control mechanism can include a heating system (not shown) or a cooling system (not shown) that is configured to adjust and/or control the temperature of movable chuck 30 and microelectronic workpiece 10. The heating system or cooling system may comprise a re-circulating flow of heat transfer fluid that receives heat from movable chuck 30 and transfers heat to a heat exchanger system (not shown) when cooling, or transfers heat from the heat exchanger system to movable chuck 30 when heating. In other embodiments, heating/cooling elements, such as resistive heating elements, or thermo-electric heaters/coolers can be included in the movable chuck 30.

Referring again to FIG. 2, the treatment apparatus 1 may include a controller 70 that is coupled to the workpiece translational drive system 32 and the workpiece rotational drive system 34, and programmed with instructions to controllably scan the microelectronic workpiece 10 relative to the at least one nozzle 50 and controllably rotate the microelectronic workpiece 10 relative to the at least one nozzle 50. As described above, the controller 70 is programmed to rotatably index the microelectronic workpiece 10 from a first predetermined indexed orientation to a second predetermined indexed orientation. The controller 70 may be coupled to the indexing motor and programmed to rotate the workpiece at a predetermined rotation rate between the first predetermined indexed orientation and the second predetermined indexed orientation. The controller 70 may further be coupled to the vertical lift system and the indexing motor, and programmed to rotate the microelectronic workpiece 10 at a predetermined rotation rate between the first predetermined indexed orientation and the second predetermined indexed orientation.

Figure 3:
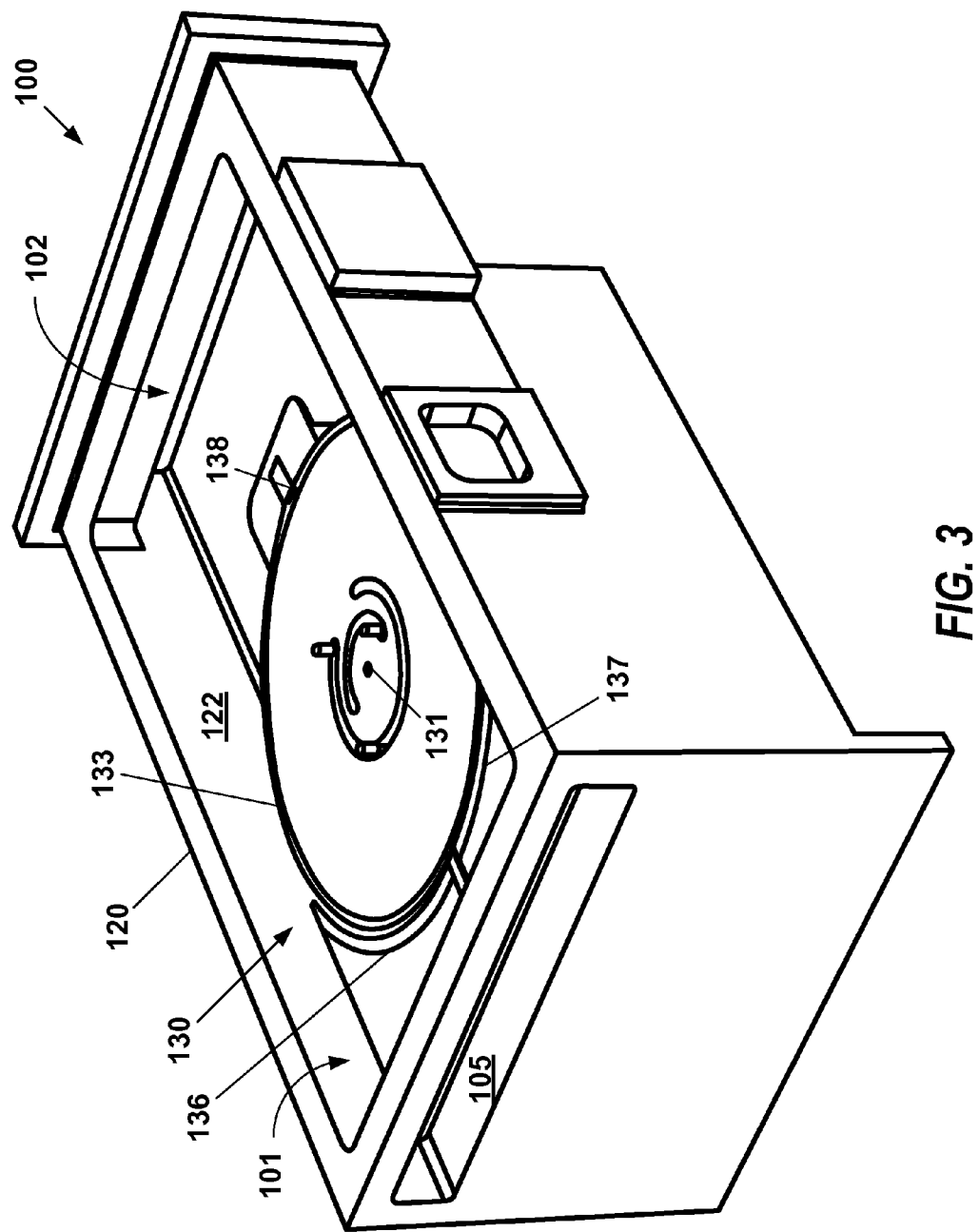
FIGS. 3 through 7 provide schematic illustrations in perspective view and cross-section of a treatment apparatus according to an embodiment of the present invention.

According to an embodiment of the present invention, FIGS. 3 through 7 provide a schematic illustrations in perspective view and cross-section of a treatment apparatus 100 for treating an exposed surface of a microelectronic workpiece (not shown). As shown in FIG. 3, the treatment apparatus 100 comprises a treatment chamber 120 defining an interior space 122 (or volume) to treat the microelectronic workpiece with at least one fluid spray within the treatment chamber 120, wherein the treatment chamber 120 further includes an inlet end 101, into which a microelectronic workpiece may be transferred through opening 105, and an outlet end 102 arranged to receive a flow of material exiting the interior space 122 and direct the flow of material to a vacuum pump (not shown). Within the interior space 122, the treatment apparatus 100 includes a movable chuck 130 that supports a microelectronic workpiece on a center protrusion 131 and edge protrusion 133.

The microelectronic workpiece is clamped to the movable chuck 130 using a first leading edge winged clamp member 136, a second leading edge winged clamp member 137, and a trailing edge clamp member 138. In one embodiment, the scanning of the microelectronic workpiece through the fluid spray may be performed such that impingement of fluid spray on the first and second winged clamp members 136, 137 is substantially avoided, while fluid spray coverage of the entire exposed surface of the microelectronic workpiece is achieved.

Figure 4:
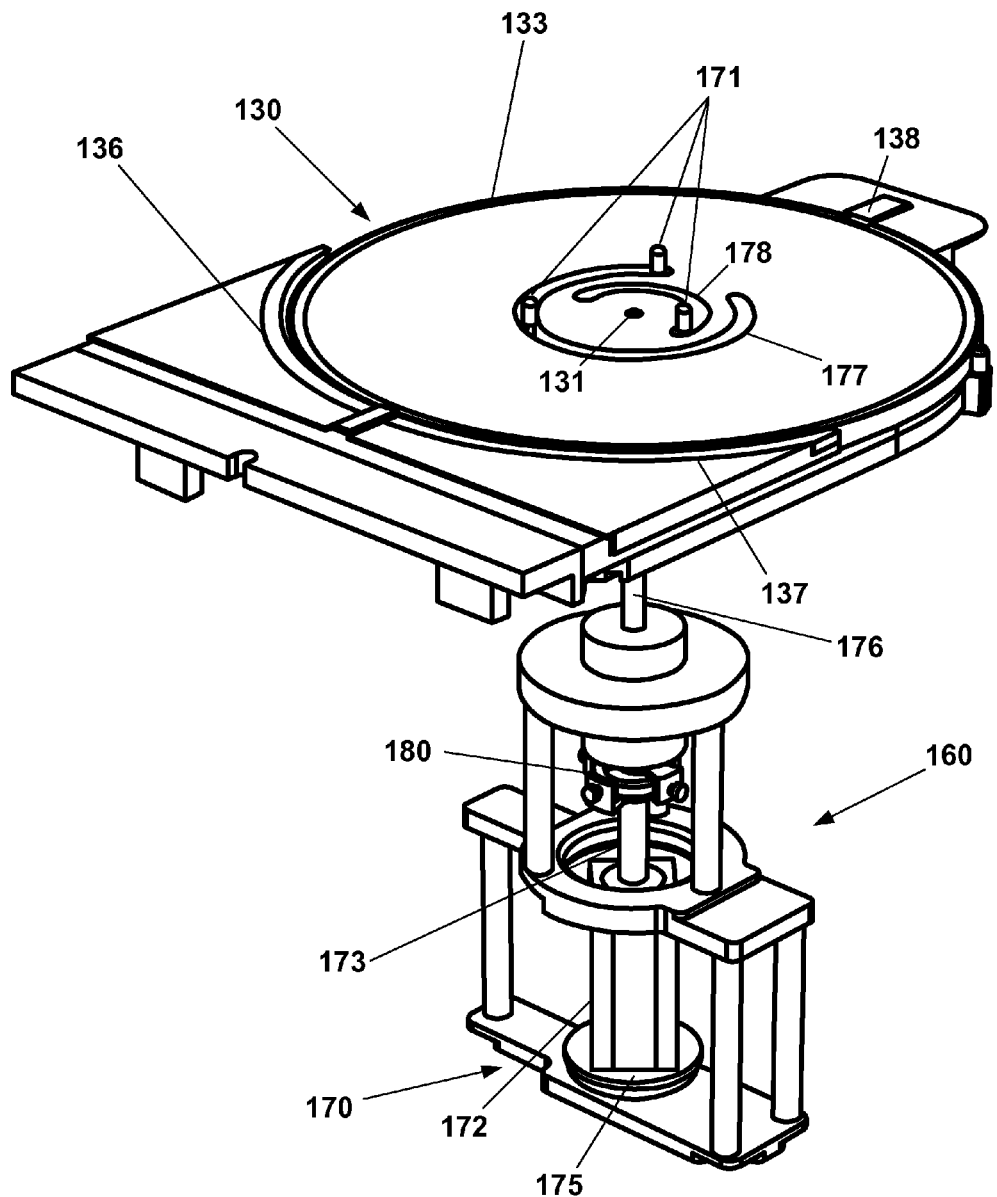
Figure 5:
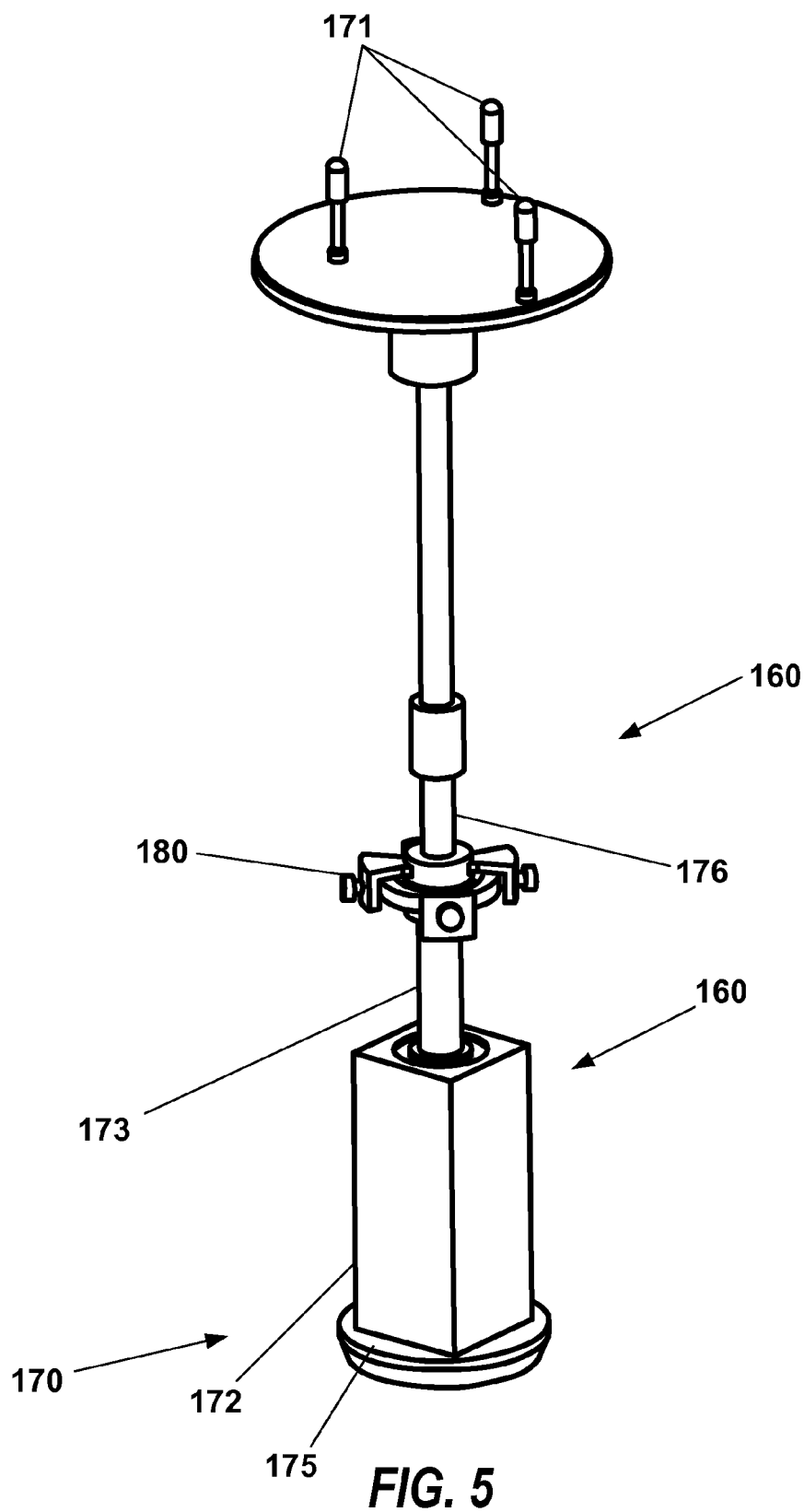

As shown in FIG. 4, the treatment apparatus 100 further includes a workpiece rotational drive system 160 configured to rotatably index the microelectronic workpiece relative to the movable chuck 130. As shown in FIGS. 4 and 5, the workpiece rotational drive system 160 includes a workpiece lift system 170 arranged beneath the movable chuck 130, and configured to translate vertically and rotate the microelectronic workpiece relative to the movable chuck 130. The workpiece lift system 170 comprises a pneumatic cylinder 172 having pneumatic piston 173 affixed to a rotatable table 175. Additionally, the rotatable table 175 may be rotated using a pneumatic rotary actuator (not shown). While pneumatic actuation has been described for vertical/translational and rotational movement, electric actuators, for example, may be used.

Vertical and rotational motion is coupled to the microelectronic workpiece via three or more lift pins 171 coupled to a distal end of a substrate lifting shaft 176 driven by the pneumatic piston 173 through piston-shaft coupling 180. The three or more lift pins 171 are arranged to extend through one or more openings 177, 178 in the movable chuck 130. The one or more openings 177, 178 may include two arcuate slots. As shown in FIGS. 4 and 5, two lift pins may extend through a first opening 177 and rotate about the shaft axis of the workpiece lifting shaft 176, and one lift pin may extend through a second opening 178 and rotate about the shaft axis of the workpiece lifting shaft 176. Alternatively, the three or more lift pins 171 may extend through a single, appropriately sized opening. However, if temperature control of the microelectronic workpiece is important, it may be desirable to minimize the total area of the one or more openings 177, 178 to avoid or reduce temperature variations in the microelectronic workpiece. While not shown, an indexing motor coupled to the rotatable table 175 is arranged to rotate the microelectronic workpiece on the three or more lift pins 171 relative to the movable chuck 130 from a first predetermined indexed orientation to a second predetermined indexed orientation.

Figure 6:
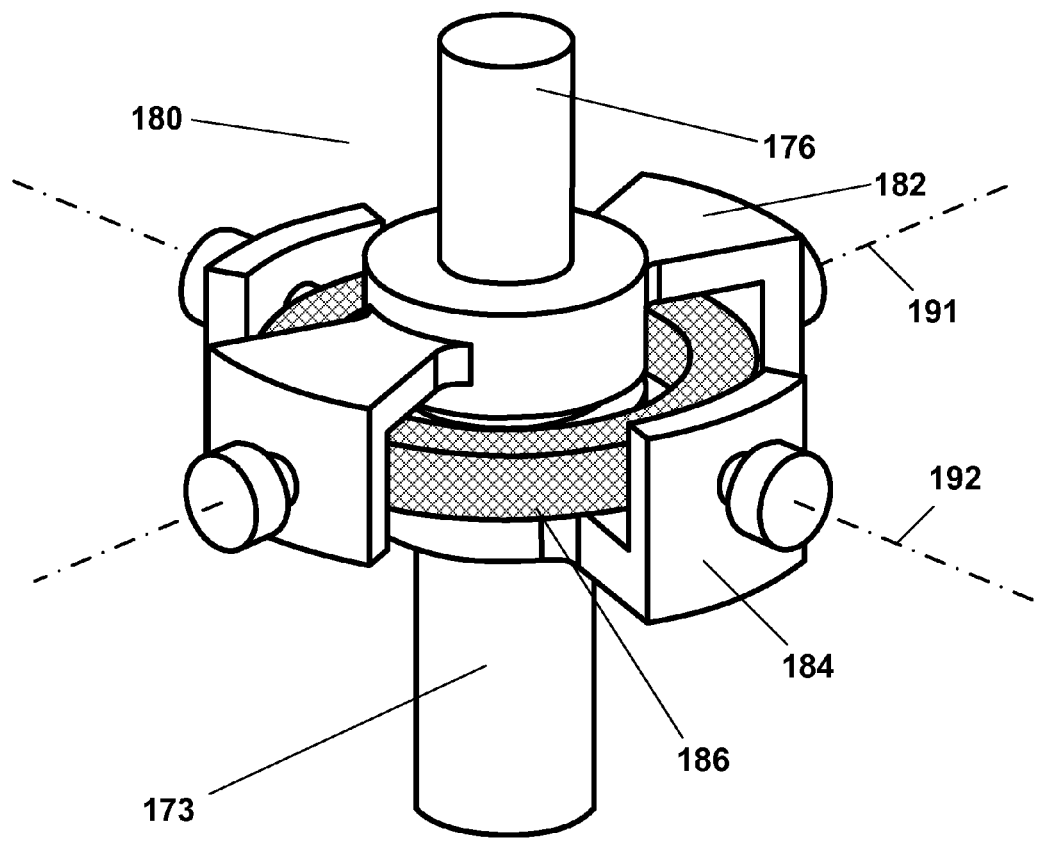

As shown in the detail view in FIG. 6, the piston-shaft coupling 180 may include a universal joint that provides aligned or misaligned motion transfer, both linear and rotational, between two shafts. The piston-shaft coupling 180 may comprise a first U-shaped member 182 centered on and affixed to the workpiece lifting shaft 176, a second U-shaped member 184 centered on and affixed to the pneumatic piston 173, and a ring-shaped floating member 186, wherein the first U-shaped member 182 is coupled to the ring-shaped floating member 186 via a first pair of diametrically arranged shoulder screws aligned on a first axis 191, and the second U-shaped member 184 is coupled to the ring-shaped floating member 186 via a second pair of diametrically arranged shoulder screws that are aligned on a second axis 192 orthogonal to the first axis 191. The universal joint in FIG. 6 provides motion coupling, without, for example, binding and back-lash, when misalignment between the workpiece lifting shaft 176 (i.e., first shaft) and the pneumatic piston 173 (i.e., second shaft) occurs. The misalignment may include axis off-set (e.g., deviation in axis alignment), angular deviations (e.g., non-parallel shafts), or combinations thereof. Moreover, the universal joint of FIG. 6. reduces or minimizes any lateral force on the workpiece lifting shaft 176 (i.e., first shaft) which, for example, preserves vacuum integrity at vacuum seals (see below and FIG. 7), reduces vacuum seal wear, and simplifies the motion transfer design (e.g., removes shims, etc.), among other things.

Figure 7:
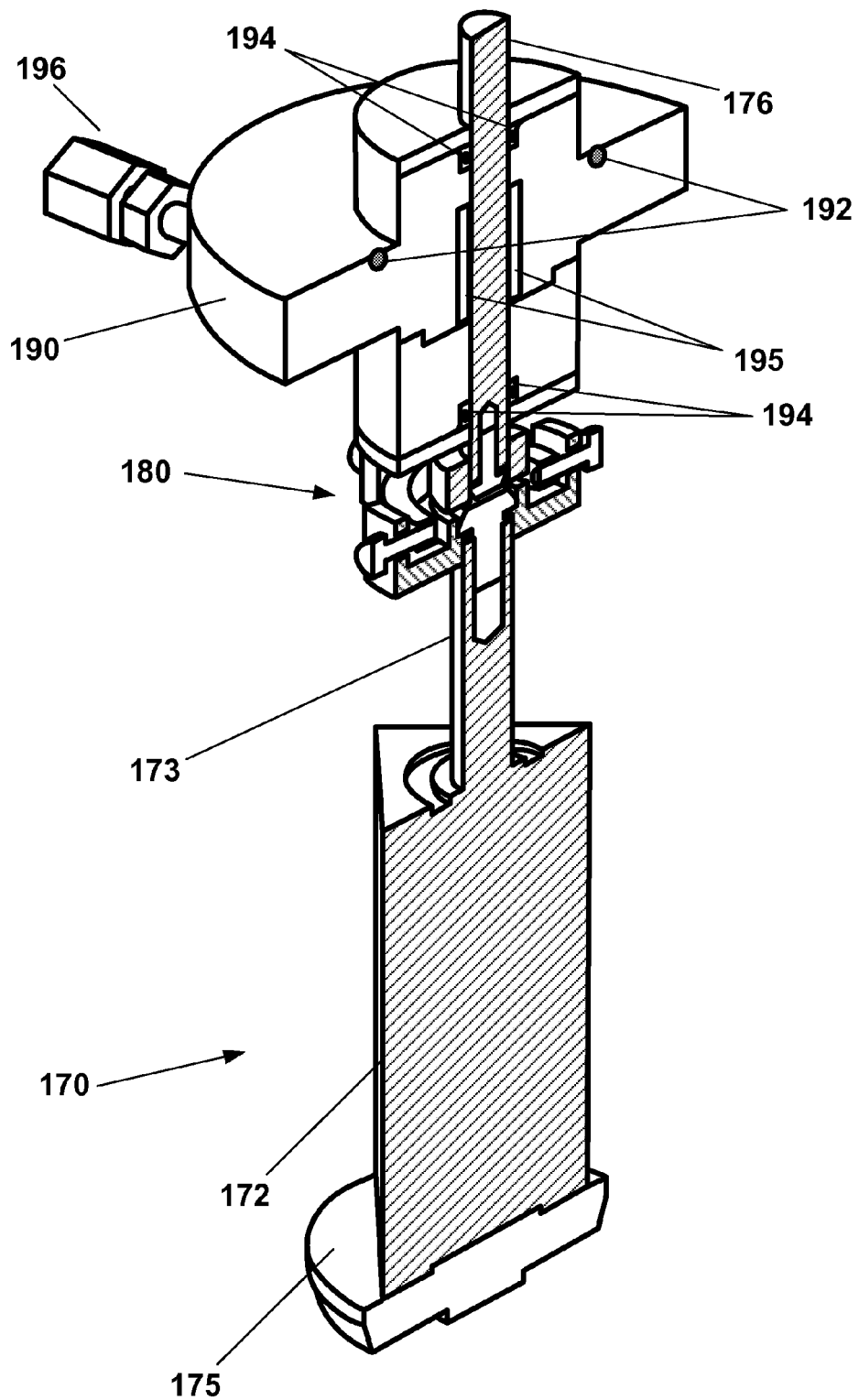

As depicted in a partial cross-section in FIG. 7, the workpiece rotational drive system 160 further includes chamber mounting flange 190 that achieves a first vacuum seal with treatment chamber 120 via O-ring seal 192 and a second vacuum seal with workpiece lifting shaft 176 via sliding shaft seals 194. The workpiece lifting shaft 176 rotates and translates on bearings 195. Furthermore, the space between the second vacuum seal with workpiece lifting shaft 176 made via sliding shaft seals 194 can be differentially pumped via vacuum line connection to coupling 196.

Figure 8:
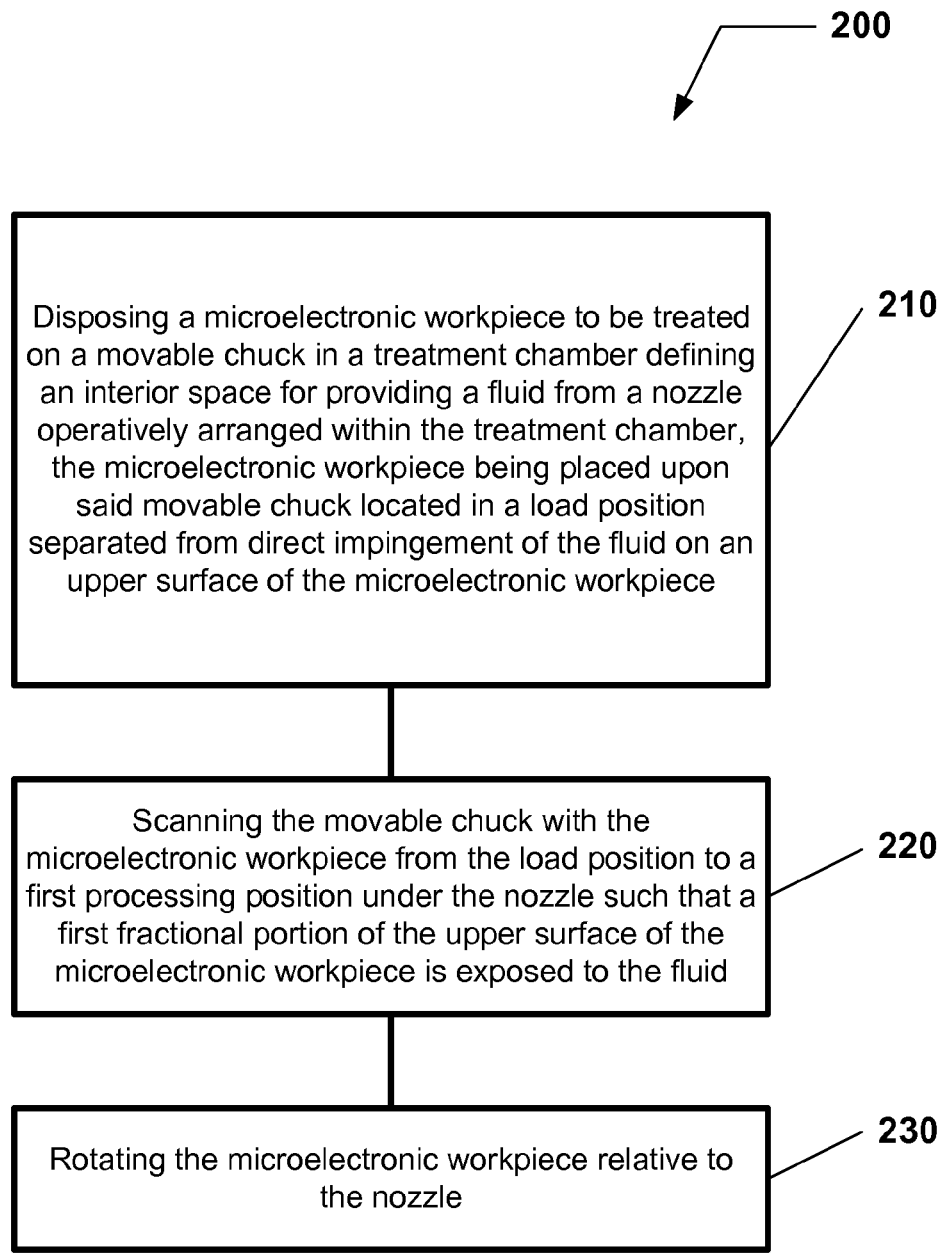
FIG. 8 provides a flow chart presenting a method of treating a microelectronic workpiece with a fluid according to various embodiments.

FIG. 8 illustrates a method for treating the surface of a microelectronic workpiece via impingement of the exposed surface with a fluid spray according to an embodiment. The method is illustrated in a flow chart 200, and begins in 210 with disposing a microelectronic workpiece to be treated on a movable chuck in a treatment chamber defining an interior space for providing a fluid spray from a nozzle operatively arranged within the treatment chamber, wherein the microelectronic workpiece is placed upon the movable chuck located in a load position separated from direct impingement of the fluid spray on an upper surface of the microelectronic workpiece. The treatment chamber may include any one of the embodiments presented in FIGS. 1 through 7. In 220, the movable chuck is scanned with the workpiece from the load position to a first processing position under the nozzle such that a first fractional portion of the upper surface of the workpiece is exposed to the fluid spray.

In 230, the microelectronic workpiece is rotated relative to the nozzle. In one embodiment, the rotating of the microelectronic workpiece comprises rotatably indexing microelectronic workpiece from a first predetermined indexed orientation to a second predetermined indexed orientation.

In other embodiments, the rotating of the microelectronic workpiece is performed either: (i) before the scanning of the microelectronic workpiece to the first processing position and while fluid spray does not impinge on the exposed surface of the microelectronic workpiece; (ii) during the scanning of the microelectronic workpiece to the first processing position and while fluid spray impinges on the exposed surface of the microelectronic workpiece; (iii) after the scanning of the microelectronic workpiece to the first processing position and while fluid spray impinges on the exposed surface of the microelectronic workpiece; or (iv) after the scanning of the microelectronic workpiece to the first processing position and while fluid spray does not impinge on the exposed surface of the microelectronic workpiece.

In another embodiment, the rotating of the microelectronic workpiece may include: (1) rotatably indexing the microelectronic workpiece from a first predetermined indexed orientation to a second predetermined indexed orientation prior to scanning the movable chuck to the first processing position; (2) returning the movable chuck with the microelectronic workpiece from the first processing position to the load position following the scanning of the movable chuck to the first processing position; and (3) rotatably indexing the microelectronic workpiece from the second predetermined indexed orientation back to the first predetermined indexed orientation following the returning of the movable chuck from the first processing position. The method may further comprise: (4) scanning the movable chuck with the microelectronic workpiece from the load position to a second processing position under the nozzle such that a second fractional portion of the upper surface of the microelectronic workpiece is exposed to the fluid spray; and (5) returning the movable chuck with the microelectronic workpiece from the second processing position to the load position following the scanning of the movable chuck to the second processing position.

According to this embodiment presented in steps (1) through (5), the microelectronic workpiece enters and exits the treatment chamber in the same orientation. The second predetermined indexed orientation may include a 180 degree angular rotation from the first predetermined indexed orientation, for example. The microelectronic workpiece may include a circular substrate characterized by a diameter, wherein the scanning of the movable chuck with the microelectronic workpiece from the load position to the first processing position exposes a diametral span of the workpiece to the fluid spray that ranges from about 50% of the diameter to about 80% of the diameter. Additionally, the scanning of the movable chuck with the microelectronic workpiece from the load position to the second processing position exposes a diametral span of the microelectronic workpiece to the fluid spray that ranges from about 50% of the diameter to about 80% of the diameter. The diametral span during scanning of the microelectronic workpiece to the first processing position and during the scanning of the microelectronic workpiece to the second processing position may be more or less than the ranges specified above.

In yet another embodiment, the rotating of the microelectronic workpiece may include: (1) rotatably indexing the microelectronic workpiece from a first predetermined indexed orientation to a second predetermined indexed orientation; and then (2) scanning the movable chuck with the microelectronic workpiece from the load position to a second processing position under the nozzle such that a second fractional portion of said upper surface of said workpiece is exposed to said fluid spray.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method for treating an upper surface of a microelectronic workpiece via impingement of the exposed surface with a fluid spray, said method comprising:
    (a) spraying the fluid spray from a nozzle positioned in a treatment chamber;
    (b) positioning a moveable chuck in a load position separated from direct impingement of the fluid spray, said moveable chuck comprising at least one translational degree of freedom to facilitate linearly translating the moveable chuck through the fluid spray;
    (c) disposing the microelectronic workpiece on the movable chuck in the load position;
    (d) positioning said microelectronic workpiece on the moveable chuck in a first rotational indexed orientation;
    (e) while the microelectronic workpiece is positioned in the first, rotational indexed orientation, linearly translating said movable chuck to linearly scan said microelectronic workpiece through the fluid spray sprayed from said nozzle in a first linear scan such that a first fractional portion of said upper surface of said microelectronic workpiece is exposed to said fluid spray during the first linear scan;
    (f) rotating said microelectronic workpiece relative to said nozzle to position the microelectronic workpiece in a second, rotational indexed orientation; and
    (g) while the microelectronic workpiece is in the second, rotational indexed orientation, linearly translating said movable chuck to linearly scan said microelectronic workpiece through the fluid spray sprayed from said nozzle in a second linear scan such that a second fractional portion of said upper surface of said microelectronic workpiece is exposed to said fluid during the second linear scan.

2. The method of claim 1, wherein step (d) is performed (i) before said first linear scan and while fluid does not impinge on said upper surface of said microelectronic workpiece, or (ii) during said first linear scan.

3. The method of claim 1, wherein step (d) further comprises positioning the moveable chuck in a load position and placing the microelectronic workpiece on the moveable chuck while the chuck is in the load position; and wherein step (f) comprises:
    (i) rotatably indexing said microelectronic workpiece from the first rotational indexed orientation to the second rotational indexed orientation prior to the second linear scan; and
    (ii) returning said movable chuck with said microelectronic workpiece to a load position following said first linear scan and prior to the second linear scan.

4. The method of claim 1, wherein said second rotational indexed orientation is about a 180 degree angular rotation from said first rotational indexed orientation.

5. The method of claim 1, wherein said microelectronic workpiece includes a circular substrate characterized by a diameter, wherein said first linear scan exposes a first diametral span of said microelectronic workpiece to said fluid spray that ranges from about 50% of said diameter to about 80% of said diameter, and wherein said second linear scan exposes a second diametral span of said microelectronic workpiece to said fluid spray that ranges from about 50% of said diameter to about 80% of said diameter.

6. The method of claim 1, wherein said fluid spray comprises an aerosol.

7. The method of claim 1, wherein step (f) comprises using pins that project through arcuate slots in the moveable chuck to lift and indexably rotate the microelectronic workpiece relative to the moveable chuck.

8. The method of claim 3, further comprising the step of, after step (g), rotatably indexing said microelectronic workpiece from said second rotational indexed orientation back to said first rotational indexed orientation and returning said movable chuck to the load position.

9. The method of claim 6, wherein the fluid spray comprises a cryogenic aerosol.

* * * * *

UNITED STATES PATENT AND TRADEMARK OFFICE
CERTIFICATE OF CORRECTION

PATENT NO. : 9,321,087 B2
APPLICATION NO. : 14/022979
DATED : April 26, 2016
INVENTOR(S) : Mark Goluch et al.

Page 1 of 1

It is certified that error appears in the above-identified patent and that said Letters Patent is hereby corrected as shown below:

On the Title Page

(73)
Assignee: "TFL FSI, Inc." should be -- TEL FSI, Inc. --

Signed and Sealed this
Thirteenth Day of August, 2019

Andrei Iancu
*Director of the United States Patent and Trademark Office*